United States Patent
Kuwashima et al.

(10) Patent No.: US 7,743,666 B2
(45) Date of Patent: Jun. 29, 2010

(54) TUNNELING EFFECT ELEMENT AND PHYSICAL QUANTITY TO ELECTRICAL QUANTITY TRANSDUCER

(75) Inventors: Tetsuya Kuwashima, Tokyo (JP); Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 735 days.

(21) Appl. No.: 11/389,065

(22) Filed: Mar. 27, 2006

(65) Prior Publication Data

US 2006/0220781 A1    Oct. 5, 2006

(30) Foreign Application Priority Data

Mar. 31, 2005    (JP)    ............................. 2005-100933

(51) Int. Cl.
G01L 1/00    (2006.01)
(52) U.S. Cl. ....................................................... 73/779
(58) Field of Classification Search .................... 73/779, 73/799
See application file for complete search history.

(56) References Cited

U.S. PATENT DOCUMENTS

| | | | | |
|---|---|---|---|---|
| 2,920,298 A * | 1/1960 | Hines | ............................. | 338/3 |
| 3,447,045 A | 5/1969 | Hickmott | | |
| 4,812,800 A * | 3/1989 | Fuchs et al. | ..................... | 338/2 |
| 5,679,888 A | 10/1997 | Tohda et al. | | |
| 5,710,437 A * | 1/1998 | Kurakado et al. | ............. | 257/32 |
| 5,856,617 A * | 1/1999 | Gurney et al. | ................. | 73/105 |
| 6,365,286 B1 * | 4/2002 | Inomata et al. | .......... | 428/811.1 |
| 7,059,203 B2 * | 6/2006 | Asai et al. | .............. | 73/862.046 |
| 7,116,209 B2 * | 10/2006 | Hermann et al. | ................ | 338/2 |
| 7,123,455 B2 * | 10/2006 | Jayasekara | ............... | 360/324.2 |
| 7,160,572 B2 * | 1/2007 | Fujikata et al. | ............. | 427/127 |
| 7,323,348 B2 * | 1/2008 | Aoyagi et al. | .................. | 438/2 |
| 2002/0073785 A1 | 6/2002 | Prakash et al. | | |

FOREIGN PATENT DOCUMENTS

| | | |
|---|---|---|
| JP | 60-74580 | 4/1985 |
| JP | 9-18070 | 1/1997 |
| JP | 2002-148132 | 5/2002 |
| JP | 2003-37312 | 2/2003 |

OTHER PUBLICATIONS

Wright, P. W. et al., "Sensitive Pressure Monitoring Device," Review of Scientific Instruments, vol. 46, No. 11, pp. 1474-1477, Nov. 1975, XP002515407.

* cited by examiner

Primary Examiner—Lisa M Caputo
Assistant Examiner—Octavia Davis
(74) Attorney, Agent, or Firm—Oblon, Spivak, McClelland, Maier & Neustadt, L.L.P.

(57) ABSTRACT

A tunneling effect element, including an insulating layer that forms a tunneling barrier, a lower electrode that is conductive and non-magnetic, and is formed on a bottom surface of said insulating layer, an upper electrode that is conductive and non-magnetic, and is formed on a top surface of said insulating layer, and a transmission member. The transmission member is made of insulating material that is formed surrounding the insulating layer and the lower and upper electrodes. The transmission member is also formed on a surface of an object to be detected, and transmits deformation of the object to be detected to the insulating layer. The tunneling effect element detects a change in stress of the object to be detected as a change in electric resistance.

13 Claims, 7 Drawing Sheets

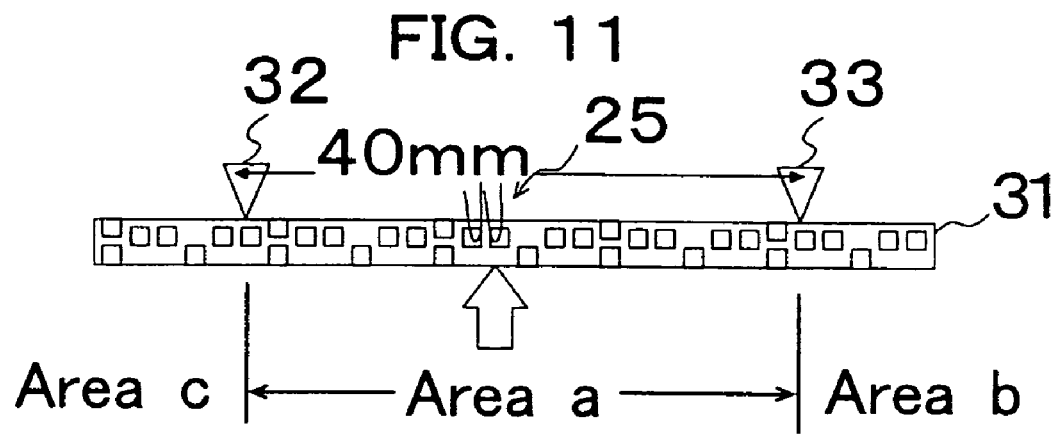
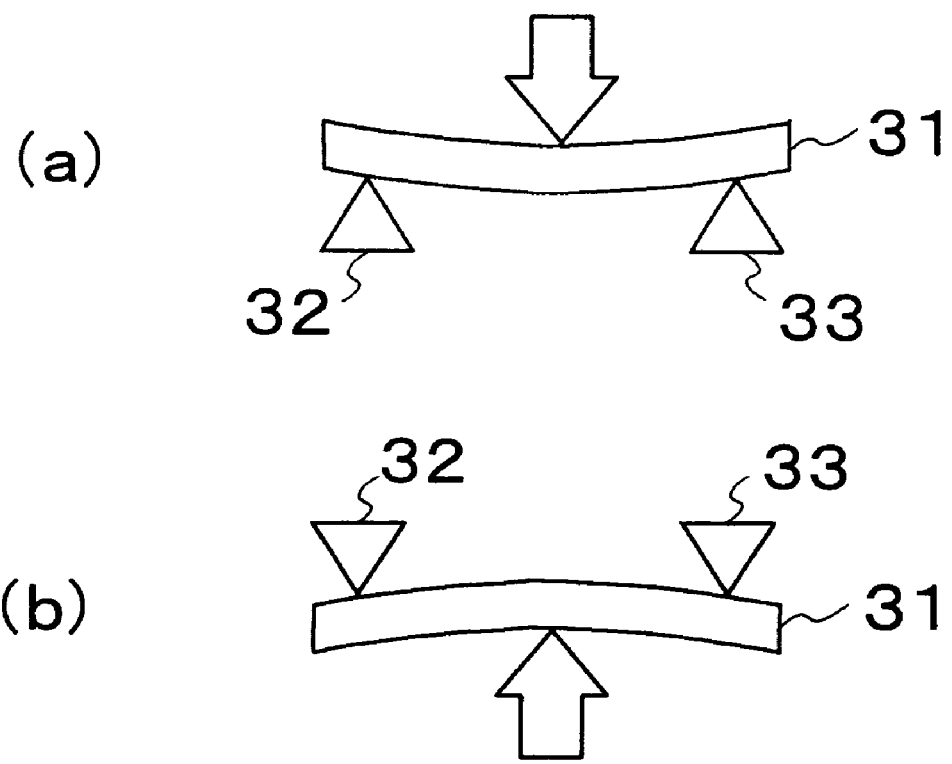

TUNNELING EFFECT ELEMENT AND PHYSICAL QUANTITY TO ELECTRICAL QUANTITY TRANSDUCER

BACKGROUND OF THE INVENTION

1. Field of the Invention

This invention relates to a tunneling effect element that receives a physical-quantity such as acceleration, pressure, load, displacement or the like and produces a strain, and shows a change in resistance that corresponds to that strain, and relates to a physical-quantity to electrical-quantity transducer such as an acceleration transducer, pressure transducer, load transducer, displacement transducer or the like that converts the aforementioned physical-quantity to an electrical-quantity based on the resistance change of the tunneling effect element.

2. Description of the Related Art

In conventional micro-detector elements, there are elements in which the sensor unit for detecting a pressure change in the detected object comprises a tunneling-magnetoresistive-effect element having a magnetostriction section in part of the magnetic member (for example, see Patent Document 1). Hereafter this technology will be called the first prior art.

Also, in conventional stress sensors comprising a tunneling-magnetoresistive-effect element, there are stress sensors in which the tunneling-magnetoresistive-effect element is surrounded by magnetic shielding (for example, see Patent Document 2). Hereafter, this technology will be called the second prior art.

According to the above mentioned first and second prior art, when compared with a strain gage having a small amount of resistance change on the scale of several hundred mΩ, the first and second prior art have an advantage in that (1) the circuit pattern is simple since there is no need for a Wheatstone bridge circuit or the like, and (2) localized displacement in minute locations can be detected since the area contributing to the pressure sensitivity is small.

[Patent Document 1]
Japanese Patent Publication Number 2002-148132 (claim 1, paragraphs [0028] and [0035] to [0036], and FIGS. 4 and 5)

[Patent Document 2]
Japanese Patent Publication Number 2003-37312 (claim 1, paragraphs [0020] to [0028], and FIG. 1)

SUMMARY OF THE INVENTION

Problems to be Solved by the Invention

However, according to the first prior art described above, as can be seen from the fact that, (1) in the detection operation a uniform external magnetic field must be applied to the tunneling-magnetoresistive-effect element, and (2) besides a tunneling-magnetoresistive-effect element, it is possible to use a magnetoresistive-effect element, giant-magnetoresistive-effect element, magneto-impedance element or electromagnetic induction coil as the sensor unit, the characteristic unique to a tunneling effect element that the tunneling-transition probability changes is not used. In other words, above described the operating principle of the micro-detection element is that the moment rotates by applying stress to the magnetostriction member, and the resistance value of the tunneling-magnetoresistive-effect element changes due to that. Therefore, when a change in resistance due to a disturbance magnetic field is added as noise to the change in resistance that corresponds to the pressure that is originally being detected, there is a problem in that stable output cannot be obtained. Therefore, there is a problem in that it is difficult to apply the micro-detection element to locations where a fairly large disturbance magnetic field occurs, for example, in a magnetic disk drive as an acceleration sensor, in an automobile as an impact sensor.

On the other hand, according to the second prior art, magnetic shielding surrounds the magnetoresistive-effect element, so stable output can be obtained even in conditions where a large disturbance magnetic field occurs such as inside a magnetic disk drive or inside an automobile. However, since an element having an anisotropic-magnetoresistive effect, or an element having a giant-magnetoresistive effect (GMR effect) can also be used instead of a tunneling-magnetoresistive-effect element as the magnetoresistive-effect element that is used in this second prior art, the characteristic unique to a tunneling effect element that the tunneling-transition probability changes is not used. Therefore, naturally, when the object to be detected is a magnetic material, the element cannot be employed, so there is a problem in that the element lacks versatility.

Moreover, in the first prior art described above, the tunneling-magnetoresistive-effect element is constructed by layering a thin magnetic conductive film having a high spin polarization such as Fe20—Ni80 film, an aluminum-oxide (alumina) ($Al_2O_3$) film, and magnetic thin film having a large magnetostriction constant such as Fe—Co50 film in order onto an insulating substrate. In other words, since the material of the bottom thin film and that of the top thin film, between which a tunneling barrier is located, differ, there probably exists a difference between the thermal-expansion coefficient of each. Therefore, when there are fluctuations in the temperature of the environment in which the object to be detected is placed, thermal-expansion stress occurs near the tunneling barrier, which could cause thermal drift. In the case of the second prior art described above, detailed construction of, and the materials used in the tunneling-magnetoresistive-effect element are neither disclosed nor suggested, so the aforementioned problem cannot be solved.

Taking the circumstances described above into consideration, the object of the present invention is to provide a tunneling effect element and physical-quantity to electrical-quantity transducer capable of solving problems as described above.

Means for Solving the Problem

In order to solve the aforementioned problems, a tunneling effect element according to an aspect of the invention comprises: an insulating layer that forms a tunneling barrier; a lower electrode that is conductive and is formed on a bottom surface of said insulating layer; an upper electrode that is conductive and is formed on a top surface of said insulating layer; and a transmission member that is formed around said insulating layer and said lower and upper electrodes, and transmits the behavior of an object to be detected to said insulating layer.

Also, in one aspect, the tunneling effect element detects a change in stress of said object to be detected as a change in electric resistance.

Furthermore, in another aspect, a resistance area product of the tunneling effect element, which is the product of the resistance value and the surface area, is 100 k Ω·μm2 or less.

Also, inyet another aspect, lower and upper electrodes are non-magnetic.

Moreover, in some aspects the lower and upper electrodes are made of the same material.

Furthermore, in some aspects, the tunneling effect element has an internal inherent strain due to stress which is less than ±3%.

Also, in other aspects, a physical-quantity to electrical-quantity transducer is provided which includes a tunneling effect element according to one of the above-noted aspects, which includes a first wiring section that is electrically connected to the lower electrode and a second wiring section that is electrically connected to the upper electrode.

Advantage of the Invention

According to this invention, it is possible to provide a tunneling effect element that has versatility and that does not receive the effects of drift due to differences in the thermal-expansion coefficient of the lower and upper electrodes, and is not easily affected by external magnetic fields.

BRIEF DESCRIPTION OF THE DRAWINGS

FIG. 11 is a conceptual diagram for measuring the Resistance Change Ratio that is obtained when the tunneling effect element shown in FIG. 1 is mounted on the object to be detected.

FIG. 12A is a conceptual diagram for explaining the meaning of an upward bend (UB), and FIG. 12B is a conceptual diagram for explaining the meaning of a downward bend (DB).

EXPLANATION OF REFERENCE NUMBERS

Figure 1:
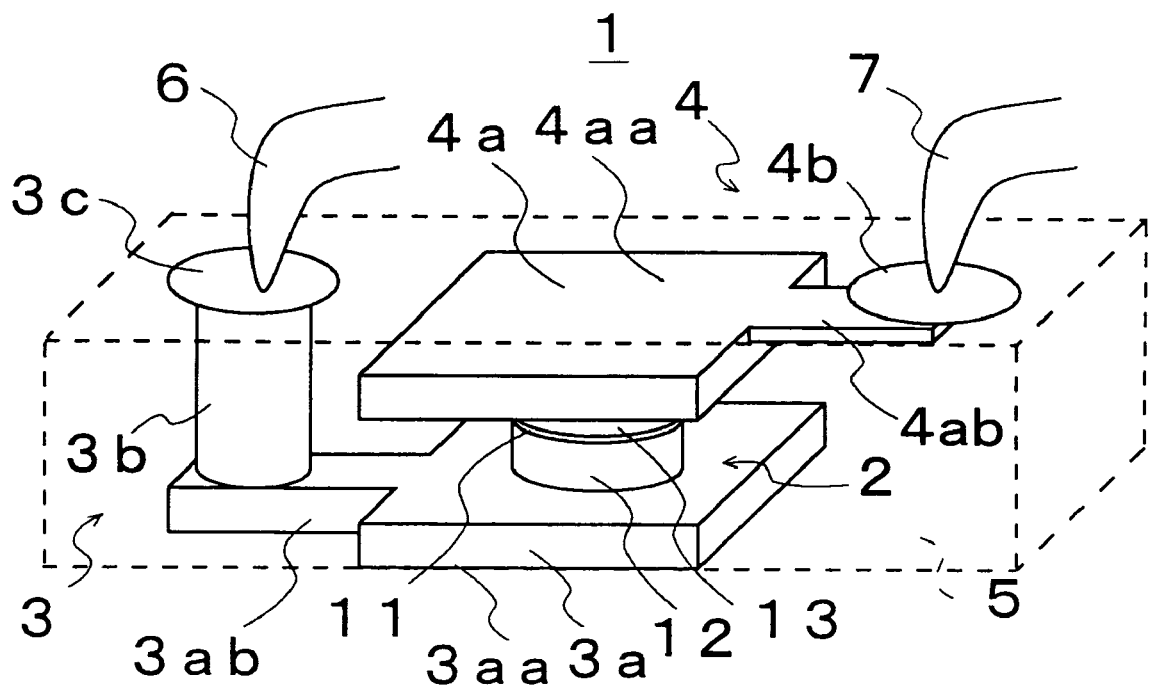
FIG. 1 is a external view showing the overall structure of the tunneling effect element of a first embodiment of the invention.

1 Tunneling effect element
2, 41 Sensor unit
3, 4 Wiring section
3a, 4a Plate section
3aa, 4aa Wide section
3ab, 4ab Narrow section
3b Column-shaped section
3c, 4b Pad section
5, 46 Transmission member (filling material)
6, 7, 25 Probe
11, 42x, 42y Insulating layer
12, 43 Lower electrode
13, 44x, 44y Upper electrode
21, 22, 31 Detected object
23, 24, 32, 33 Support member
43a Wiring area
45 Insulation layer

DESCRIPTION OF THE PREFERRED EMBODIMENTS

Embodiments of the Preferred Invention

Embodiment 1

Figure 2:
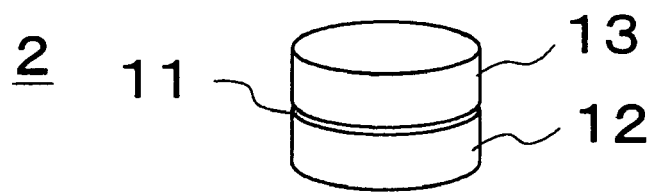
FIG. 2 is a perspective view showing the external construction of the sensor unit forming the tunneling effect element shown in FIG. 1
Figure 3:
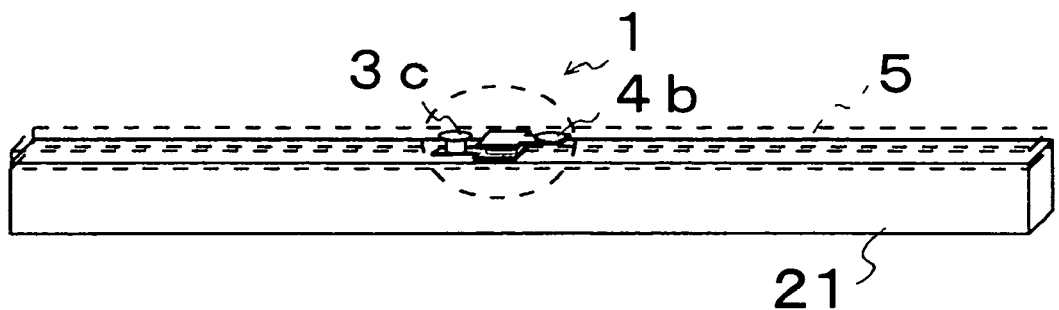
FIG. 3 is a partially transparent and perspective view showing the state of the tunneling effect element shown in FIG. 1 mounted on the object to be detected.

FIG. 1 is a external view showing the overall structure of the tunneling effect element of a first embodiment of the invention; FIG. 2 is a perspective view showing the external construction of the sensor unit 2 forming the tunneling effect element 1 shown in FIG. 1; and FIG. 3 is a partially transparent and perspective view showing the state of the tunneling effect element 1 shown in FIG. 1 mounted on the object 21 to be detected. The tunneling effect element 1 of this example comprises a sensor unit 2, wiring sections 3 and 4, and a transmission member (filling material) 5 that is filled in around the element 1. As shown in FIG. 2, the sensor unit 2 comprises: an insulating layer 11 forming a tunneling barrier, a lower electrode 12 and an upper electrode 13. The insulating layer 11 is made, for example, from aluminum oxide ($Al_2O_3$), magnesium oxide (MgO) or the like, and has an approximately circular column shape. The insulating layer 11, for example, has a diameter of approximately 100 nm, and thickness of approximately 1 nm. Both the lower electrode 12 and upper electrode 13 are, for example, made from a non-magnetic, good conductor such as Tantalum (Ta) and have an approximately circular column shape. Both the lower electrode 12 and upper electrode 13 have a diameter of approximately 100 nm and a thickness of approximately 30 nm, for example.

Also, in FIG. 1, the wiring section 3 is made from copper (Cu), for example. The wiring section 3 comprises: an approximately T-shaped plate section 3a (as seen from the top), an approximately circular column-shaped section 3b, and an approximately disk-shaped pad section 3c. Integrating a wide section 3aa and a narrow section 3ab unitarily forms the plate section 3a. The thickness of the plate section 3a is 200 nm, for example. The top surface in the approximately central position of the wide section 3aa is electrically connected to the bottom surface of the lower electrode 12. On the other hand, the top surface of the end of the narrow section 3ab that is on the opposite side from the wide section 3aa is electrically connected to the bottom surface of the circular column section 3b. Also, the top surface of the circular column section 3b is electrically connected to the bottom surface of the pad section 3c. A probe 6 made of gold (Au) and the like, comes in contact with the top surface of the pad section 3c, and the other end of the probe 6 (not shown in the figure) is electrically connected to a detection circuit (not shown in the figure).

Moreover, the wiring section 4 is made from copper (Cu), for example. The wiring section 4 comprises: an approximately T-shaped plate section 4a (as seen from the top), and an approximately disk-shaped pad section 4b. Integrating a wide section 4aa and a narrow section 4ab unitarily forms the plate section 4a. The thickness of the plate section 4a is 200 nm, for example. It is not shown in FIG. 1, however, the bottom surface in the approximately central position of the wide section 4aa is electrically connected to the top surface of the upper electrode 13. On the other hand, the top surface of the end of the narrow section 4ab that is on the opposite side from the wide section 4aa is electrically connected to the bottom surface of the pad section 4b. A probe 7 made of gold (Au) and the like, comes in contact with the top surface of the pad section 4b, and the other end of the probe 7 (not shown in the figure) is electrically connected to a detection circuit (not shown in the figure).

The filling material 5 is made from an insulating material such as aluminum oxide ($Al_2O_3$), magnesium oxide (MgO) or the like. As shown in FIG. 3, for example, the filling material 5 is firmly filled on the top surface of the object 21 to be detected, and surrounds the tunneling effect element 1 so that the behavior of the object 21 to be detected is efficiently transmitted to the tunneling effect element 1 via the filling material 5. As was described above, concerning the tunneling effect element 1 and filling material 5, everything except for the insulating layer 11 forming the tunneling effect element 1, is formed on the top surface of the object to be detected using a thin-film formation technique such as chemical vapor deposition (CVD), vacuum evaporation or sputtering, a lithography technique, etching technique or plating technique.

On the other hand, when the insulating layer 11 is made of aluminum oxide ($Al_2O_3$), it is formed by any one of the following methods: (1) natural oxidation in air after forming metallic aluminum on the lower electrode 12; (2) oxidation by the plasma oxidation method in air or in a vacuum after metallic aluminum is formed on the lower electrode 12; (3) forming an aluminum oxide ($Al_2O_3$) film using a thin-film-formation technique such as CVD, vacuum evaporation or sputtering.

Next, the reasons for setting the size, shape and material of the sensor unit 2 as described above will be described. For the sensor unit 2, smaller is better performance to detect localized displacement of a minute location, however, in the case of making the sensor unit 2 small, it increases the resistance value of the sensor unit 2 and is generally inconvenient for process. In the case that the resistance value of the sensor unit 2 is high (for example 100 MΩ or greater), the voltage applied between the lower electrode 12 and upper electrode 13 becomes high, so non-typical circuit elements must be used in the direct-current power supply. On the other hand, in the case that the resistance value of the sensor unit 2 is low (for example 10Ω or less), there is a possibility of current leakage occurring in the insulating layer 11. Therefore, it is preferred that the resistance value of the sensor unit 2 be 100Ω to 1 MΩ.

Figure 4:
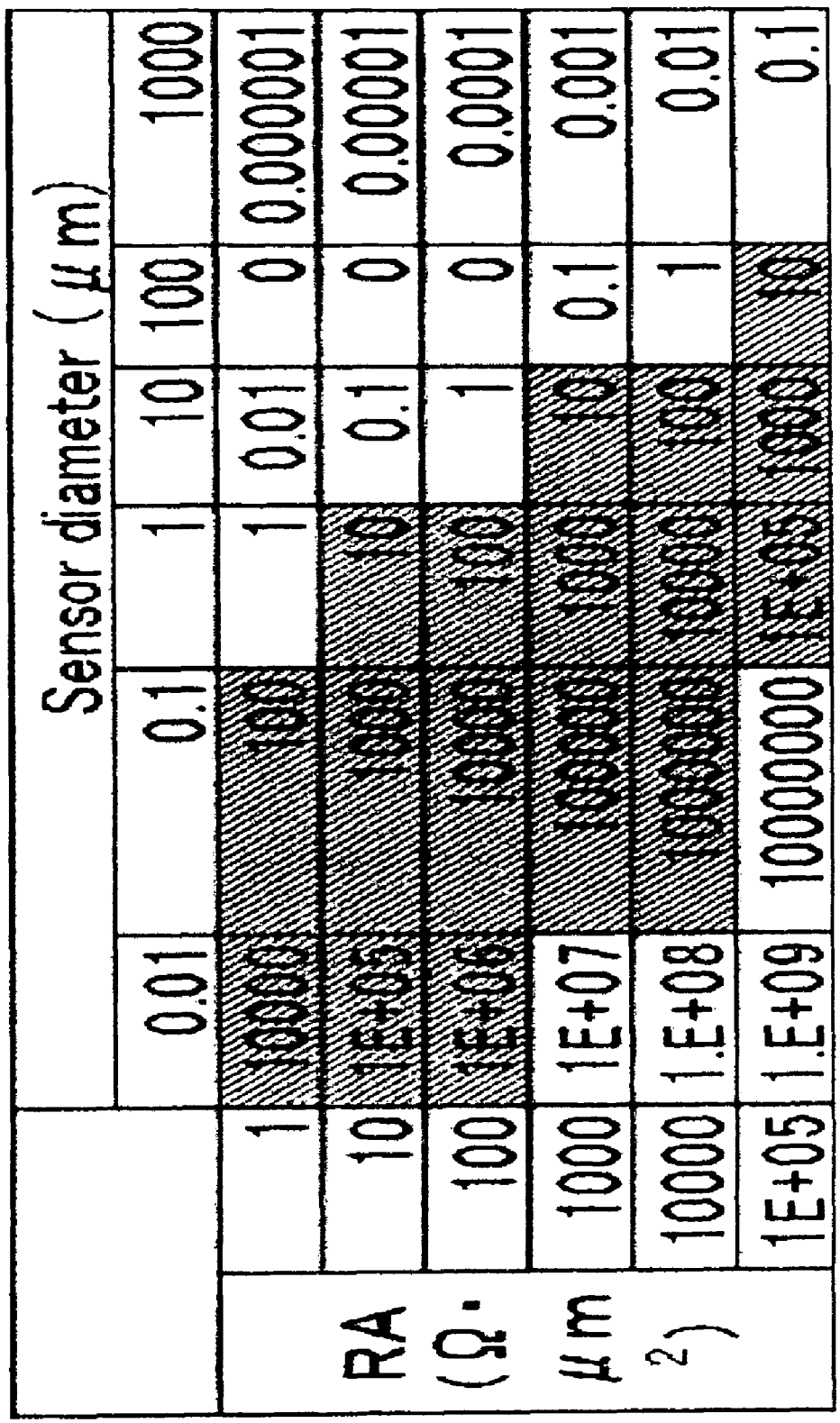
FIG. 4 is a drawing showing an example of approximation results for the relationship between the diameter and resistance area product RA of the sensor unit in the tunneling effect element.

In order to maintain the resistance value of the sensor unit 2 at 100Ω to 1 MΩ even if the sensor unit 2 is made small, it is necessary to keep the resistance area product RA, which is the product of the resistance value and surface area of the sensor unit 2, low, and as the result of devoted study by the inventors, it was found that a resistance area product (RA) of 100 kΩ·μm$^2$ or less is preferred. FIG. 4 shows the approximation results for the relationship between the diameter and resistance area product RA of the sensor unit 2 having an approximately circular column shape. In FIG. 4, the shaded area is the practical range. Therefore, in this first embodiment, the diameter of the sensor unit 2 is 100 nm. Also, in the case of designing very small sensors in which the diameter of the sensor unit 2 is 10 nm or less, it is preferred that the resistance area product RA be 1 kΩ·μm$^2$ or less.

Next, the relationship between the thickness and resistance area product RA of the insulating layer 11 forming the sensor unit 2 will be described. First, the inventors consideres a sensor unit 2 that operates based on the following operating principles:

(a) When a physical-quantity such as acceleration, pressure, load, displacement or the like is applied to the sensor unit 2, the physical-quantity is transmitted to the insulating layer 11 forming the tunneling barrier, and the insulating layer 11 deforms. The most notable deformation of the insulating layer 11 is one concerning the thickness of the insulating layer 11.

(b) When the thickness of the insulating layer 11 changes, the resistance value of the sensor unit 2 changes logarithmically.

Figure 5:
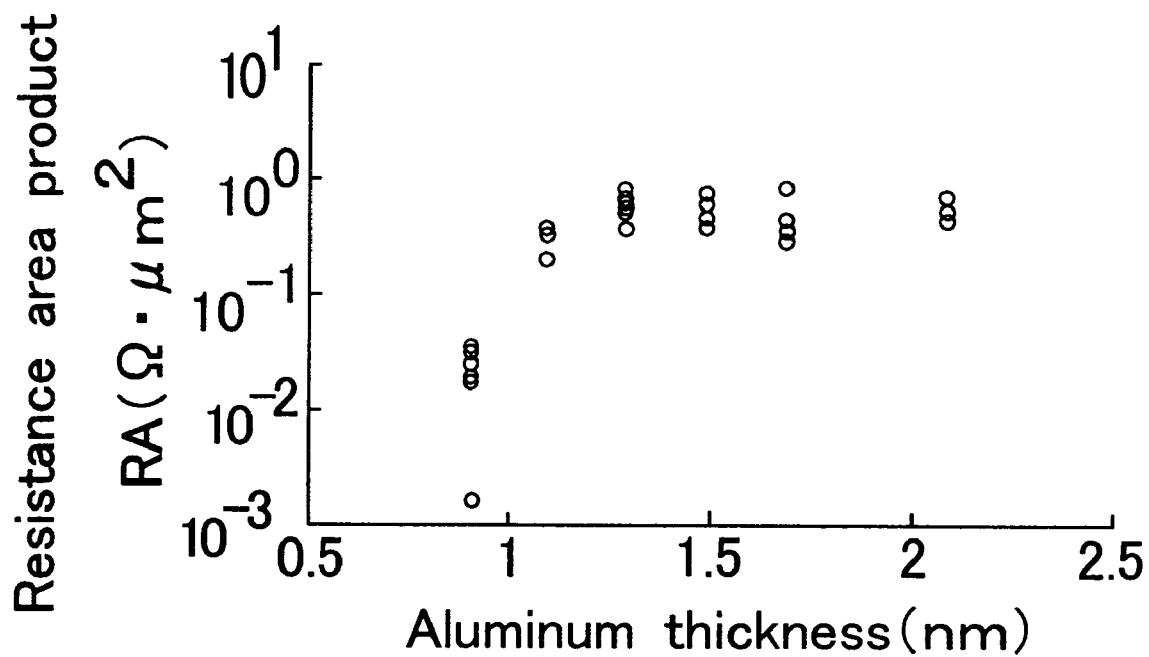
FIG. 5 is a drawing showing an example of the relationship between the thickness of the aluminum of the sensor unit and resistance area product RA.

Therefore, in order for the sensor unit 2 to obtain large changes in resistance value with respect to the applied physical-quantity, the thickness of the insulating layer 11 is an important element. FIG. 5 is an example that shows the relationship between the thickness and resistance area product RA of aluminum that is formed on a top surface of the lower electrode forming the sensor unit (refer to Kazuo Kobayashi et al., 'Tunneling type Giant Magnetoresistive, a Spin Valve Type Tunnel Junction', Materia Japan, Vol. 37, No. 9 (1998), p. 736-740). Here, the thickness of the aluminum refers to the thickness of the metallic aluminum that is formed on a lower electrode before natural oxidation occurs in the case of constructing the insulating layer forming the sensor unit using aluminum oxide ($Al_2O_3$). As can be seen from FIG. 5, in areas where the thickness of the aluminum is thinner than 1.3 nm, the resistance area product RA greatly relies on the thickness of the aluminum and large changes in resistance can be obtained as a sensor unit.

Figure 6:
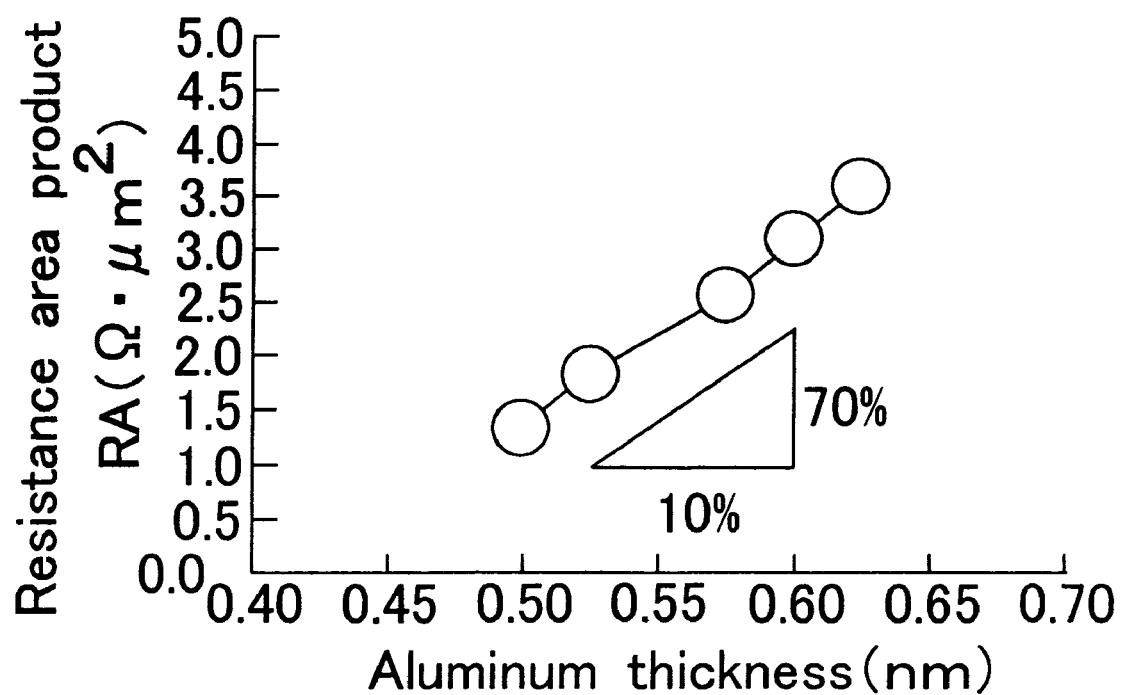
FIG. 6 is a drawing showing an example of the relationship between the thickness of the aluminum of the sensor unit and resistance area product RA.

The inventors experimentally found the relationship between the thickness and resistance area product RA of aluminum for areas where the thickness of aluminum is even thinner than that shown in above FIG. 5. FIG. 6 shows an example of the relationship between the thickness and resistance area product RA of aluminum that was found experimentally. The experiment results that are shown in FIG. 6 use Tantalum (Ta) film having a thickness of 30 nm as the lower and upper electrodes. In FIG. 6, it can be seen that when the thickness of the aluminum changes by 10%, the resistance area product RA change linearly only 70%. In other words, the resistance area product RA greatly relies on the thickness of the aluminum and large changes in resistance can be obtained as the sensor unit 2 in areas where the thickness of the aluminum is 1.3 nm or less. Aluminum having a thickness of 1.3 nm becomes an aluminum oxide film having a thickness of 2.0 nm to 2.5 nm by natural oxidation, so in this first embodiment, the thickness of the insulating layer 11 is made to be approximately 1 nm. The maximum thickness for which the resistance area RA product changes linearly does not change much even when the material of the insulating layer 11 changes. The minimum thickness of the insulating layer 11 for which a uniform film can be obtained is about 0.4 nm.

Also, the reason that the insulating layer 11, as well as both the lower electrode 12 and upper electrode 13, have an approximately circular column shape, and that the tunnel junction section has a circular shape is because importance was placed on ease of processing, however the shape of the insulating layer 11, lower electrode 12 and upper electrode 13, and the shape of the tunnel junction can be any shape such as an approximately square column shape or rectangular shape as long as there is no problem in processing them. Next, both the lower electrode 12 and upper electrode 13 forming the sensor unit 2 are made from a non-magnetic, good conductor such as Tantalum (Ta). Therefore, since the thermal expansion coefficient of both the lower electrode 12 and upper electrode 13 is the same, they are not affected by drift due to differences in the thermal expansion coefficient. Also, since both the lower electrode 12 and upper electrode 13 are made from a non-magnetic such as Tantalum (Ta), it is difficult for them to be affected by an external magnetic field.

Figure 7:
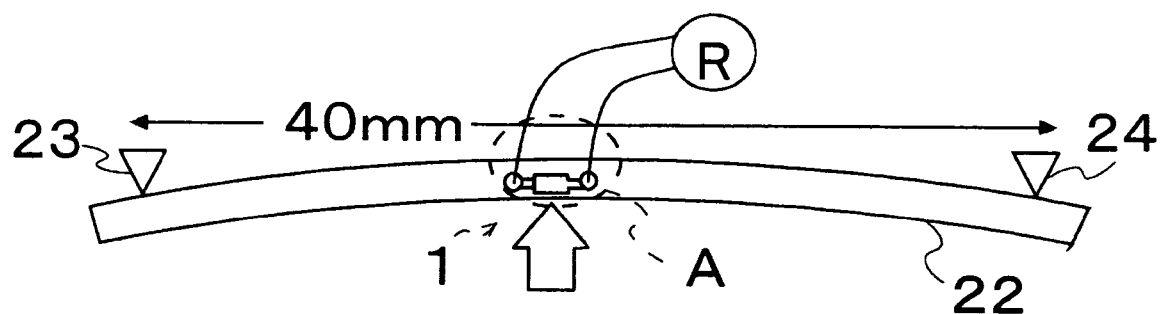
FIG. 7 is a conceptual diagram for measuring the Resistance Change Ratio that is obtained when the tunneling effect element shown in FIG. 1 is mounted onto the object to be detected.
Figure 8:
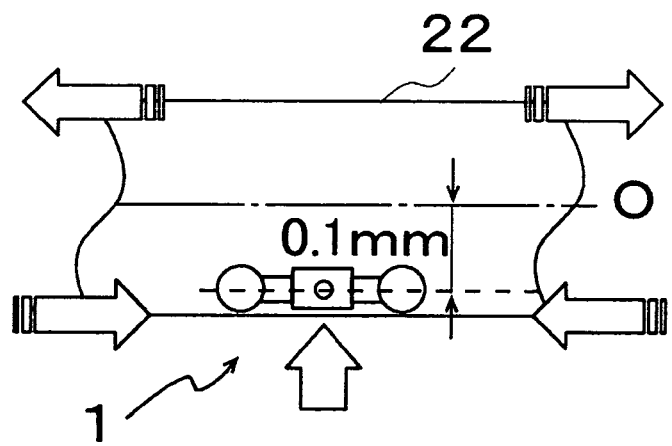
FIG. 8 is an enlarged view of the area A in FIG. 7.
Figure 9:
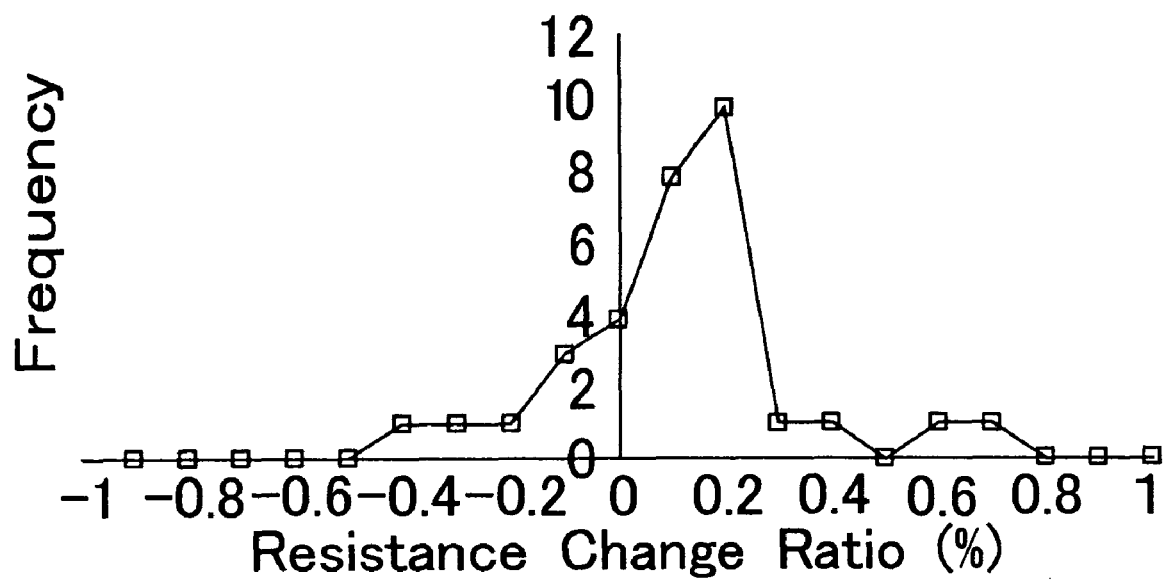
FIG. 9 is a drawing showing an example of the relationship of the frequency with respect to the Resistance Change Ratio.

Next, the Resistance Change Ratio obtained in the case that the tunneling effect element 1 constructed as described above is mounted on the object to be detected will be described. As shown in FIG. 7, a plurality of tunneling effect elements 1 are formed at desired intervals on the front surface of an approximately square column-shaped object 22 to be detected which is made of, for example, AlTiC and the like, and filled with a filling material 5 (not shown in the drawing). The width of the object 22 to be detected is approximately 0.25 mm. In FIG. 7, only one tunneling effect element 1 is shown. FIG. 8 shows an enlarged view of the area A in FIG. 7. The tunneling effect element 1 is mounted so that the sensor unit 2 forming the tunneling effect element 1 is located at an offset of just 0.1 mm from the center O of the object 22 to be detected. Also, the object 22 to be detected is supported by support members 23 and 24 that are located on the top surface of the object 22 to be detected separated by a distance of 40 mm (distance between each fulcrum of supports), and the bottom surface of the object 22 to be detected is pressed upward from the bottom so that the object 22 to be detected has a downward bend of about 1 mm. A pair of probes is brought in contact simultaneously with the two pads 3c and 4b of each of the tunneling effect elements 1, and the resistance value is measured. Therefore, as shown in FIG. 9, a 0.2% change in resistance (no-load resistance: approximately 300Ω) was measured. Inside the tunneling effect element 1 there exists a maximum ±3% inherent strain due to stress that occurs during the manufacturing process, however, this inherent strain is within the elastic deformation range of the components of the tunneling effect element 1. Therefore, detection of the change in stress using the tunneling effect element 1 is performed assuming this inherent strain.

Figure 10:
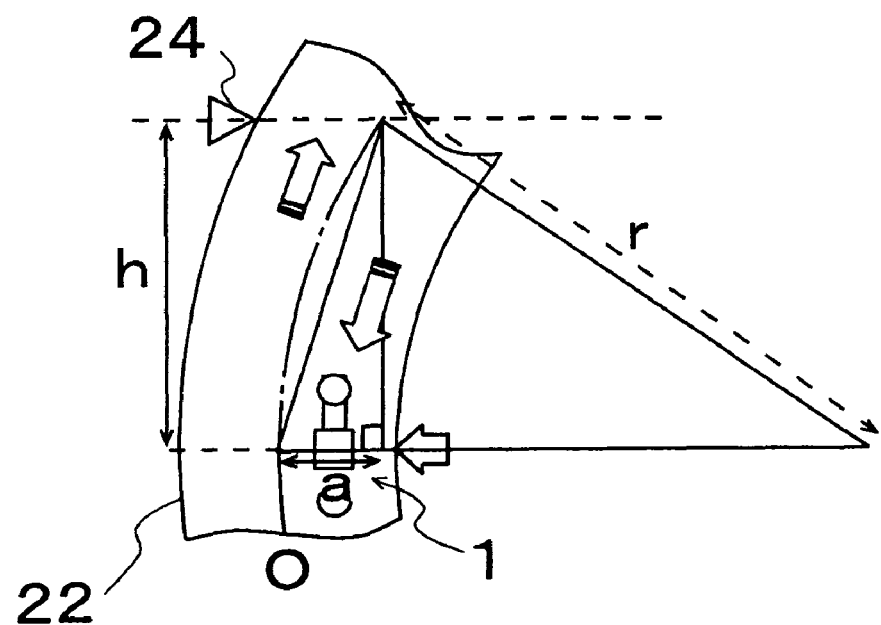
FIG. 10 is a schematic view for approximating the Resistance Change Ratio in the sensor unit of the tunneling effect element shown in FIG. 1.

The strain occurring in the sensor unit 2 due to bending of the object 22 to be detected is calculated, and the Resistance Change Ratio of the sensor unit 2 is estimated based on this. FIG. 10 is a schematic view for approximating the Resistance Change Ratio of the sensor unit 2. In FIG. 10, h is half the distance between each fulcrum of supports, and in this case it is 20 mm. Also, a is the amount that the object 22 to be detected is pressed in order to cause it to bend (pressing amount), and in this case it is 1 mm. Furthermore, r is the radius of curvature around the centerline O of the object 22 to be detected. Therefore, h, a and r are related by the following equation (1).

$$r^2 = h^2 + (r-a)^2 \quad (1)$$

By substituting h=20 mm and a=1 mm into Equation (1), the radius of curvature r becomes 200.5 mm.

Here, as shown in FIG. 8, since the sensor unit 2 is offset just 0.1 mm from the center O of the object 22 to be detected, the radius of curvature of the sensor unit 2 becomes 200.4 mm. Therefore, the horizontal compressibility of the sensor unit 2 becomes 0.049%, as given by Equation (2).

$$\{(200.5-200.4)/200.5\} \times 100 = 0.049(\%) \quad (2)$$

The rate of change in the film thickness of the insulating layer 11 when the sensor unit 2 is pressed from the horizontal direction in the case that the insulating layer is made using aluminum oxide is expressed by Equation (3), where the Poisson's ratio for aluminum oxide is 0.24.

$$0.24 \times 0.049 = 0.1176 \approx 0.012(\%) \quad (3)$$

From the relationship between the thickness and resistance area product RA of aluminum shown in FIG. 6, it can be experimentally seen that when the thickness of the aluminum changes by 10%, the resistance area product RA change linearly only 70%. In this case, the thickness of the insulating layer 11 changes just 0.012%, so, as shown by Equation (4), the Resistance Change Ratio can be approximated as 0.084%.

$$0.012 \times 70/10 = 0.084\% \quad (4)$$

When comparing this approximated value '0.084%' with the actual measured value '0.2%', the approximated value is a little less. However, this can be considered to be due to measurement error or factors that were not considered when performing the approximation such as effects due to the solid structure around the sensor unit 2, so the aforementioned approximated value is considered to be reasonable.

Next, as shown in FIG. 11, a plurality of tunneling effect elements 1 are formed at specified intervals on the front surface of an approximately triangular column-shaped object 31 to be detected, and filled with a filling material 5 (not shown in the figure). Similar to the detected object 22 shown in FIG. 7, the width of the object 31 to be detected in FIG. 11 is approximately 0.25 mm, also similarly, the tunneling effect elements which are not shown in the figure are mounted so that there is an offset of just 0.1 mm from the center O of the object 31 to be detected. Also, after an initial state (SS) of no external force is applied to the object 31 to be detected, a cycle consisting of an upward bend (UB), released state (RE), downward bend (DB) and released state (RE) was executed for just two cycles, and a pair of probes 25 were brought into contact simultaneously with the two pads 3c and 4b of each tunneling effect element 1, and the resistance values were measured.

As shown in FIG. 12A, the upward bend (UB) referred to here is performed by supporting the object 31 to be detected by support members 32 and 33 located on the bottom surface of the object 31 and separated by a distance of 40 mm (distance between each fulcrum of supports), and then pressing the top surface of the object 31 to be detected downward from the top approximately 2 mm to bend the object 31 to be detected upward. On the other hand, as shown in FIG. 12B, the upward bend (UB) referred to here is performed by supporting the object 31 to be detected by support members 32 and 33 located on the top surface of the object 31 and separated by a distance of 40 mm (distance between each fulcrum of supports), and then pressing the bottom surface of the object 31 to be detected upward from the bottom approximately 2 mm to bend the object 31 to be detected downward.

Figure 13:
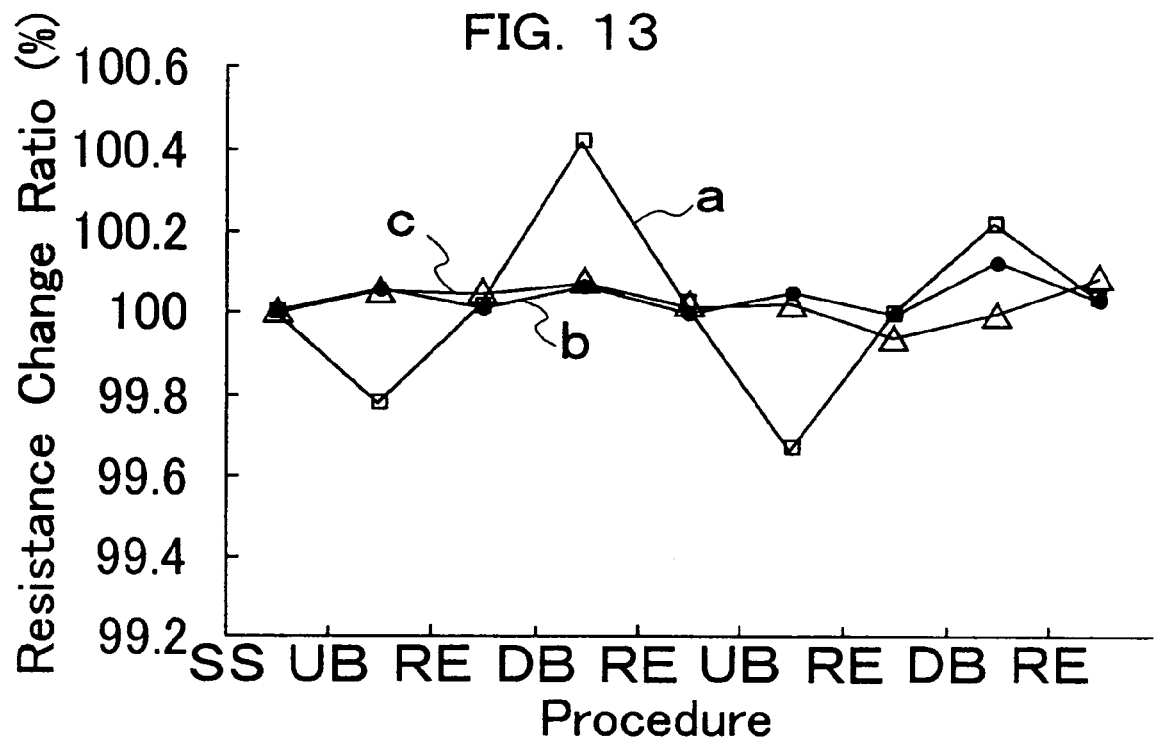
FIG. 13 is a drawing showing an example of the Resistance Change Ratio that is obtained when an upward bend (UB) and downward bend (DB) are repeated.

FIG. 13 shows an example of measurement results. In FIG. 13, line a shows the characteristics of the Resistance Change Ratio in area a shown in FIG. 11, line b shows the characteristics of the Resistance Change Ratio in area b shown in FIG. 11 where no external force is applied, and line c shows the characteristics of the Resistance Change Ratio in the area c shown in FIG. 11 where no external force is applied. From FIG. 13, it can be seen that for an upward bend (UB) and downward bend (DB) nearly opposite characteristics occur. In other words, this tunneling effect element 1 can also detect the direction of bend of the object 31 to be detected.

In this way, with this first embodiment of the invention, in comparison with a strain gage having a small amount of resistance change on the order of several 100 mΩ, it is of course possible to obtain general effects for a tunneling effect element, which are: (1) simple circuit construction in which a Wheatstone bridge circuit or the like is not necessary, and (2) it is possible to detect localized displacement since the surface area contributing to pressure sensitivity is small. Furthermore, with this first embodiment of the invention, both the lower electrode 12 and upper electrode 13 are made of a non-magnetic material having good conductivity such as Tantalum (Ta). Also, the thermal expansion coefficient of both the lower electrode 12 and upper electrode 13 are the same, so they are not affected by drift due to differences in the thermal expansion coefficient, and it is difficult for them to be affected by external magnetic fields. Therefore, stable output can be obtained even in conditions where large disturbance magnetic fields occur such as inside a magnetic disk drive or inside an automobile. Furthermore, since this embodiment of the invention can be employed even when the detected object is a magnetic material, it has sufficient versatility.

Embodiment 2

Figure 14:
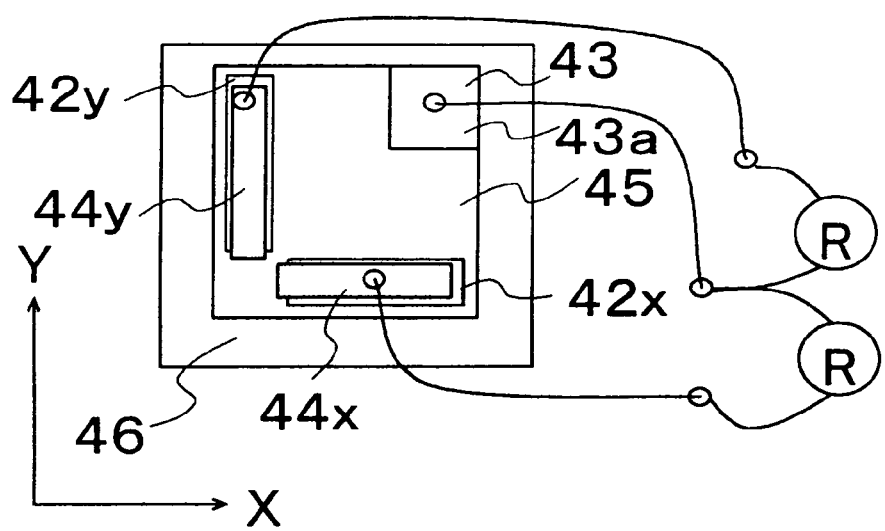
FIG. 14 is a plan view showing the external construction of the sensor unit of the tunneling effect element of a second embodiment of the invention.

FIG. 14 is a plan view showing the external construction of the sensor unit 41 forming the tunneling effect element of a second embodiment of the invention. The sensor unit 41 of this example comprises insulating layers 42$x$ and 42$y$ that form a tunneling barrier, a lower electrode 43 and upper electrodes 44$x$ and 44$y$. The insulating layers 42$x$ and 42$y$ are made from aluminum oxide ($Al_2O_3$), magnesium oxide (MgO) or the like, and are approximately rectangular. The thickness of the insulating layers 42$x$ and 42$y$ is approximately 1 nm, for example. The insulating layer 42$x$ is formed on one rectangular section of the object to be detected (not shown in the figure) by way of a transmission member 46 that transmits the behavior of the object to be detected to the insulating layer, and it is formed such that it is parallel with the x direction in the figure. On the other hand, the insulating layer 42$y$ is formed on one rectangular section of the object to be detected (not shown in the figure) by way of the transmission member 46, and it is formed such that it is parallel with the y direction in the figure.

The lower electrode 43, and upper electrodes 44$x$ and 44$y$ are all made from a non-magnetic, for example, being good conductive such as Tantalum (Ta) and have an approximately rectangular shape. The thickness of the lower electrode 43 and upper electrodes 44$x$ and 44$y$ is approximately 30 nm, for example. The lower electrode 43 is formed so that it nearly covers the entire surface of one rectangular section of the object to be detected (not shown in the figure). The upper electrode 44$x$ is formed on one rectangular section of the object to be detected (not shown in the figure) such that it is parallel with the x direction in the figure. On the other hand, the upper electrode 44$y$ is formed on one rectangular section of the object to be detected (not shown in the figure) such that it is parallel with the y direction in the figure. An insulating layer 45 is formed on the top surface of the lower electrode 43 except in the area of the insulating layers 42$x$, 42$y$ and a wiring area 43$a$. The method for forming the insulating layers 42$x$ and 42$y$, lower electrode 43 and upper electrodes 44$x$ and 44$y$ forming the sensor unit 41 described above is the same as in the first embodiment described above. Also, detectors, having this kind of construction are located on the object to be detected at specified intervals. The insulating layer 45 is similarly made from an insulating material such as an oxide or the like, as in the case of the insulating layers 42$x$ and 42$y$, however it does not need to form a tunneling barrier. In this way, with this second embodiment of the invention, it is possible to easily obtain the two-dimensional distribution of change in a physical-quantity in the X-axis direction and Y-axis direction of the object to be detected.

The preferred embodiments of the invention were described above with reference to the drawings, however, detailed construction is not limited by these embodiments, and changes to design within a range that does not depart from the scope of this invention are also included in this invention.

For example, in the first and second embodiment described above, no particular mention was made regarding the material of the object to be detected on which the sensor unit is installed. The material of the object to be detected can be any material, such as an ultra-thin glass substrate, plastic film, or the like that can be bent.

Also, in the first embodiment described above, an example was described in which the tunneling effect element 1 was installed on the front surface of the object 22 to be detected, and bending in the upward and downward direction of the object 22 to be detected was detected, however, the invention is not limited to this. For example, in the case where the sensor unit 2 is formed on the top surface of the object 22 to be detected, and bending in the planar direction is being detected, the sensor unit 2 can be formed such that it is rotated 90 degrees with respect to the direction shown in FIG. 1 so that its axis is the lengthwise direction of the object 22 to be detected, and the direction of the wiring section can be changed.

Moreover, in the second embodiment described above, an example was given in which the object to be detected is just on the side of the bottom surface of the sensor unit 41, however, the invention is not limited to this. For example, in the case where the object to be detected is on the top surface of the sensor unit 41, a separate transmission member can be formed on the top surface of the insulating layers 42$x$, 42$y$ and insulating layer 45 and the like.

Also, in each of the embodiments described above, examples were given in which the tunneling effect element was formed directly on the object to be detected, however, the invention is not limited to this, and similar to the conventional strain gage described above, it is possible, for example, to attach the tunneling effect element to the object to be detected after forming it first on a strain-causing body such as a diaphragm and the like.

Moreover, each of the embodiments described above can use the same technology as long as there are no particular discrepancies or problems with the purpose or construction.

What is claimed is:

1. A tunneling effect element comprising:
   an insulating layer that forms a tunneling barrier;
   a lower electrode that is conductive and consists of non-magnetic material, and is formed on a bottom surface of said insulating layer;
   an upper electrode that is conductive and consists of non-magnetic material, and is formed on a top surface of said insulating layer;
   a transmission member made of insulating material that is formed surrounding said insulating layer and said lower and upper electrodes, and also is formed on a surface of an object to be detected, and transmits deformation of said object to said insulating layer,
   wherein said tunneling effect element detects a change in stress of said object to be detected as a change in electric resistance arising from a change in tunneling current between said lower electrode and said upper electrode.

2. The tunneling effect element of claim 1, wherein a resistance area product, which is a product of a resistance value and a surface area of the tunneling effect element, is 100 k $\Omega \cdot \mu m^2$ or less.

3. The tunneling effect element of claim 2, further comprising:
a first wiring section that is electrically connected to said lower electrode; and
a second wiring section that is electrically connected to said upper electrode.

4. The tunneling effect element of claim 1, wherein said lower and upper electrodes are made of a same material.

5. The tunneling effect element of claim 4, further comprising:
a first wiring section that is electrically connected to said lower electrode; and
a second wiring section that is electrically connected to said upper electrode.

6. The tunneling effect element of claim 1, wherein an internal inherent strain due to stress is less than ±3%.

7. The tunneling effect element of claim 6, further comprising:
a first wiring section that is electrically connected to said lower electrode; and
a second wiring section that is electrically connected to said upper electrode.

8. The tunneling effect element of claim 1, further comprising:
a first wiring section that is electrically connected to said lower electrode; and
a second wiring section that is electrically connected to said upper electrode.

9. The tunneling effect element of claim 1, wherein:
the tunneling barrier, the lower electrode and the upper electrode form a structure having a columnar shape; and
the insulating material of the transmission member surrounds a circumferential surface of the structure.

10. The tunneling effect element of claim 1, wherein the insulating layer forms the tunneling barrier between the lower electrode and the upper electrode.

11. The tunneling effect element of claim 1, wherein a resistance area product, which is a product of a resistance value and a surface area of the tunneling effect element, is 1 k$\Omega \cdot \mu m^2$ or less.

12. The tunneling effect element of claim 1, wherein
the lower electrode is formed directly on the bottom surface of said insulating layer, and
the upper electrode is formed directly on the top surface of said insulating layer.

13. A tunneling effect element comprising:
an insulating layer that forms a tunneling barrier;
a lower electrode that is conductive and non-magnetic, and is formed directly on a bottom surface of said insulating layer;
an upper electrode that is conductive and non-magnetic, and is formed directly on a top surface of said insulating layer;
a transmission member made of insulating material that is formed surrounding said insulating layer and said lower and upper electrodes, and also is formed on a surface of an object to be detected, and transmits deformation of said object to said insulating layer,
wherein said tunneling effect element detects a change in stress of said object to be detected as a change in electric resistance arising from a change in tunneling current between said lower electrode and said upper electrode.

* * * * *